(12) United States Patent
Horan et al.

(10) Patent No.: US 12,126,346 B1
(45) Date of Patent: Oct. 22, 2024

(54) DEVICE HAVING A LATCHED RECEIVER WITH A STABLE VOLTAGE THRESHOLD

(71) Applicant: Allegro MicroSystems, LLC, Manchester, NH (US)

(72) Inventors: John Horan, Cork (IE); Guillaume Aulagnier, Cannes (FR)

(73) Assignee: Allegro MicroSystems, LLC, Manchester, NH (US)

( * ) Notice: Subject to any disclaimer, the term of this patent is extended or adjusted under 35 U.S.C. 154(b) by 35 days.

(21) Appl. No.: 18/303,740

(22) Filed: Apr. 20, 2023

(51) Int. Cl.
  H03K 5/24 (2006.01)
  H03K 3/012 (2006.01)
  H03K 3/356 (2006.01)
  H03K 19/0185 (2006.01)

(52) U.S. Cl.
  CPC ........... *H03K 5/2481* (2013.01); *H03K 3/012* (2013.01); *H03K 3/35613* (2013.01); *H03K 19/018521* (2013.01)

(58) Field of Classification Search
  CPC .. H03K 5/2481; H03K 3/012; H03K 3/35613; H03K 19/018521; H03K 3/013; H03K 3/356104; H03K 3/356113; H03K 19/018528; H03K 19/018514; G05F 3/20; G05F 3/22; G05F 3/222; G05F 3/225; G05F 3/242; G05F 3/245; G05F 3/30
  See application file for complete search history.

(56) References Cited

U.S. PATENT DOCUMENTS

| | | | |
|---|---|---|---|
| 8,577,634 B2 | 11/2013 | Donovan et al. | |
| 8,736,343 B2 | 5/2014 | Chen et al. | |
| 9,172,565 B2 | 10/2015 | Cadugan et al. | |
| 11,201,619 B2 | 12/2021 | Rinne et al. | |
| 2013/0021189 A1* | 1/2013 | Kabir | H03K 5/249 327/77 |

OTHER PUBLICATIONS

Sumathi et al., "Performance and Analysis of CML Logic Gates and Latches;" Proceedings from the 2007 International Symposium on Microwave, Antenna, Propagation and EMC Technologies for Wireless Communications; Aug. 16, 2007; 4 Pages.

\* cited by examiner

*Primary Examiner* — Jung Kim
(74) *Attorney, Agent, or Firm* — DALY, CROWLEY, MOFFORD & DURKEE, LLP

(57) ABSTRACT

Methods and apparatus for a differential receiver having a differential latch. The latch can include first and second circuits each having first and second inputs to receive a differential input signal and first and second outputs to output a differential output signal. An offset structure includes a bandgap reference circuit with a first current source and a resistor, wherein the offset compensation structure provides a stable threshold for an input signal on the first and second inputs.

36 Claims, 5 Drawing Sheets

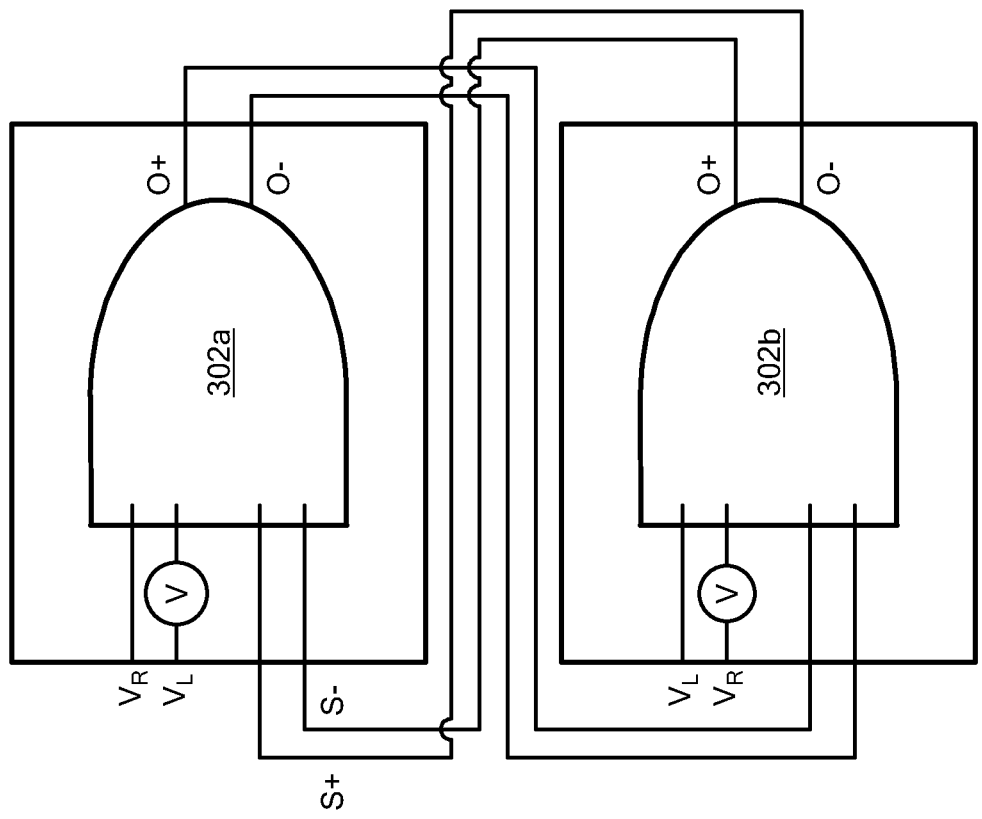
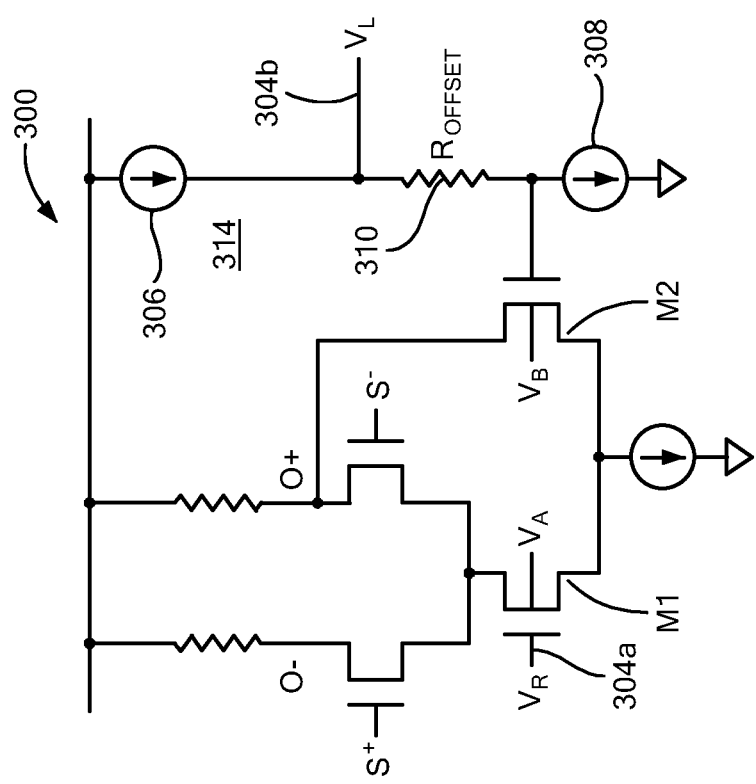
FIG. 3B
FIG. 3A

DEVICE HAVING A LATCHED RECEIVER WITH A STABLE VOLTAGE THRESHOLD

BACKGROUND

As is known in the art, signal isolator devices are useful for transmitting and receiving data signals between isolated systems, such as systems that operate in different voltage domains. Isolators provide data transmission across an isolation barrier while maintaining galvanic isolation of the systems. Known isolator devices are often differentially-driven. Data signals may move differentially about a common mode signal. Isolator devices may be useful in noisy environments in which electro-magnetic transients may cause signal corruption. Movement of thresholds set in a receiver may result in data errors.

SUMMARY

Example embodiments of the disclosure provide methods and apparatus for a differential receiver that rapidly responds to picosecond differential pulses to set and reset a differential state machine. In embodiments, the size of the differential pulses that trigger the state machine are built into the CML (current mode logic) gates and are programmable. Embodiments of the disclosure provide a latch that is fast with stable, defined thresholds in noisy environments.

In one aspect, a system having a receiver to receive data on a communication channel, comprising: a differential latch comprising: first and second circuits each having: first and second inputs to receive a differential input signal and first and second outputs to output a differential output signal, wherein the first and second circuits are cross-coupled, and wherein the first and second circuits are each configured to detect a pulse on the first and second differential input signals above a voltage threshold; and an offset structure to maintain the voltage threshold at a stable voltage level, comprising: a first current source and an offset resistor, wherein the first current source includes a bandgap circuit to flow an offset current through the offset resistor to maintain the voltage threshold at the stable voltage level.

A system can further include one or more of the following features: the stable threshold comprises a Vdiff+ above 0.05V and a Vdiff− below −0.05V, the latch comprises first and second AND gates cross-coupled to each other, the first and second AND gates comprise differential current mode logic (CML) logic gates, the bandgap circuit comprises a current generator, the current generator uses an amplifier to drive the gate NMOS device such that its source is set to the bandgap voltage, this is turn sets the current in a resistor which is attached to the source of this NMOS device, the current is set at the bandgap voltage divided by the resistance of the resistor, the current for the resistor is provided by a diode connected PMOS device, which develops an overdrive corresponding to the current, the gate of the PMOS device is connected to a mirroring PMOS device which sources the current, $I_{offset}$ to the offset resistor, the voltage threshold $V_{thresh}$ is defined as the resistance $R_{offset}$ of the offset resistor times the resistance of the reference resistor $R_{ref}$ times a constant K such that $V_{thresh}=K*R_{offset}*R_{ref}$, respective resistances of $R_{offset}$ and $R_{ref}$ change over temperature in the same way, $R_{offset}$ and $R_{ref}$ comprise the same material, the latch is capacitively isolated by respective capacitors from differential drivers for transmitting data to the latch, the respective capacitors are less than 500 fF, the latch and the drivers are on different die, and/or the receiver can form part of a three-phase motor driver IC package.

In another aspect, a method comprises: receiving data on a communication channel by a receiver; and latching the received data with the differential latch, wherein the receiver comprises first and second circuits each having: first and second inputs to receive a differential input signal and first and second outputs to output a differential output signal, wherein the first and second circuits are cross-coupled, and wherein the first and second circuits are each configured to detect a pulse on the first and second differential input signals above a voltage threshold; and an offset structure to maintain the voltage threshold at a stable voltage level, comprising: a first current source and an offset resistor, wherein the first current source includes a bandgap circuit to flow an offset current through the offset resistor to maintain the voltage threshold at a stable voltage level.

A method can further include one or more of the following features: the stable threshold comprises a Vdiff+ above 0.05V and a Vdiff− below −0.05V, the latch comprises first and second AND gates cross-coupled to each other, the first and second AND gates comprise differential current mode logic (CML) logic gates, the bandgap circuit comprises a current mirror, the bandgap circuit comprises a bandgap voltage as an input to an amplifier configured to output and maintain the bandgap voltage, the bandgap circuit comprises a current generator, the current generator uses an amplifier to drive the gate NMOS device such that its source is set to the bandgap voltage, this is turn sets the current in a resistor which is attached to the source of this NMOS device, the current is set at the bandgap voltage divided by the resistance of the resistor, the current for the resistor is provided by a diode connected PMOS device, which develops an overdrive corresponding to the current, the gate of the PMOS device is connected to a mirroring PMOS device which sources the current $I_{offset}$ through the offset resistor from the current mirror, the voltage threshold $V_{thresh}$ is defined as the resistance $R_{offset}$ of the offset resistor times the resistance of the reference resistor $R_{ref}$ times a constant K such that $V_{thresh}=K*R_{offset}*R_{ref}$, respective resistances of $R_{offset}$ and $R_{ref}$ change over temperature in the same way, $R_{offset}$ and $R_{ref}$ comprise the same material, the latch is capacitively isolated by respective capacitors from differential drivers for transmitting data to the latch, the respective capacitors are less than 500 fF, the latch and the drivers are on different die, and/or the receiver forms part of a three-phase motor driver IC package.

BRIEF DESCRIPTION OF THE DRAWINGS

The foregoing features of this invention, as well as the invention itself, may be more fully understood from the following description of the drawings in which:

FIG. 3A shows an example circuit implementation of the latch of FIG. 3, and FIG. 3B shows how coupled circuits form a complete latch;

DETAILED DESCRIPTION

Figure 1:
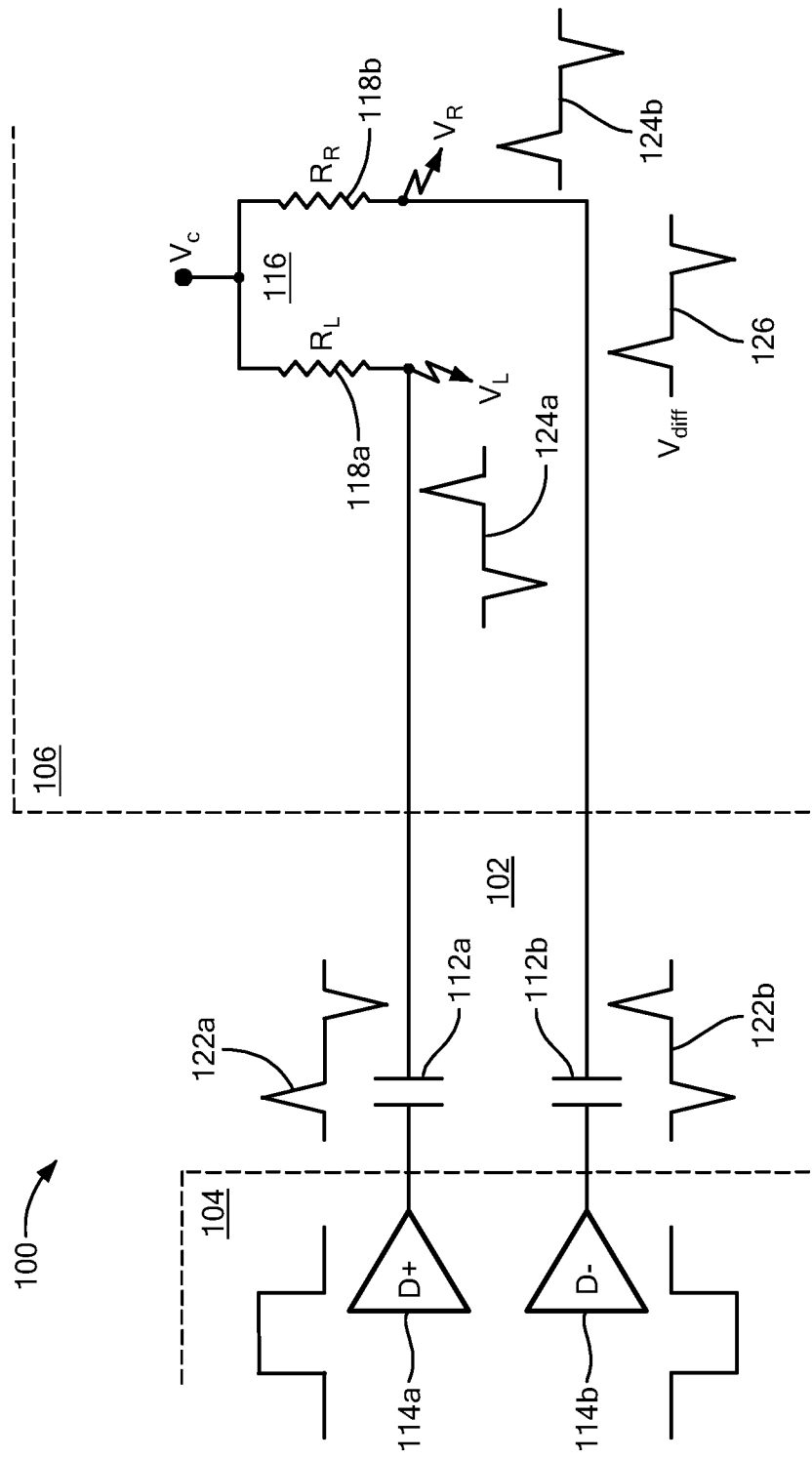
FIG. 1 shows a system having a capacitively isolated differential communication channel between a first circuit and a second circuit.

FIG. 1 shows a system 100 having a capacitively isolated differential communication channel 102 between a first circuit 104, and a second circuit 106. In the illustrated embodiment, the first and second circuits 104, 106 have different voltage domains which require the isolated communication channel 102 to exchange data. In the illustrated embodiment, the differential communication channel 102 includes a first (positive) path having a first capacitor 112a coupled between a first driver 114a on the first circuit 104 and a receiver 116 on the second circuit 106 and a second (negative) path having a second capacitor 112b coupled between a second driver 114b on the first circuit 104 and the receiver 116. In an example embodiment, the receiver 116 includes first and second resistor 118a,b coupled to a supply voltage Vc. The first resistor 118a is coupled to the first capacitor 112a and the second resistor 118b is coupled to the second resistor 118b.

The drivers 114a,b output respective voltage waveform, such as a digital pulse, that generate signals 122a, 122b on the respective first and second capacitors 112a,b, which provide the isolation barrier between the first and second systems 104, 106. Respective current waveforms 124a,b are produced on the first and second resistors 118a,b in response to the voltage waveform 120. The current waveforms 124a,b can be combined to form a differential signal 126, which be used to drive a latch, for example.

For systems with relatively large common mode voltage movement between the first and second circuits 104, 106, the size of the first and second capacitors 112a,b size can be quite small, e.g., in the order of 500 femto Farads). It will be appreciated that smaller capacitors have less energy flow through the capacitors than larger capacitors. This level of capacitance (e.g., hundreds of fFs) limits the losses due to the common mode voltage movement between the first and second circuits 104,106. When the inductive coupling is relatively small, the signal current 122a,b created might only be a few milli-amps, which is then sent to the first and second resistors 118a,b creating about a 0.5V differential swing with the width of the pulses at hundreds of picoseconds wide, which may be challenging to detect.

Processing of these pulses requires a fast latch that is accurate for the threshold set for positive and negative swings to register a set or reset of a latch. For example, a threshold may be set a Vdiff+=+0.3Vs and Vdiff-=-0.3V. These thresholds may be difficult to control over process and temperature. In embodiments, a stable threshold comprises a Vdiff+ of at least +0.05V and a Vdiff- below -0.05V.

Example embodiments of the disclosure are applicable to a wide range of applications in which it is desirable to have a differential receiver that rapidly responds to picosecond differential pulses to set and reset a differential state machine. In one embodiment, the first and second circuits 104, 106 are contained in different die within an IC package, such as a motor driver IC package, for motors driven by voltage signals in the order of hundreds of volts. That is, the system 100 may comprise a motor driver IC package.

Figure 2:
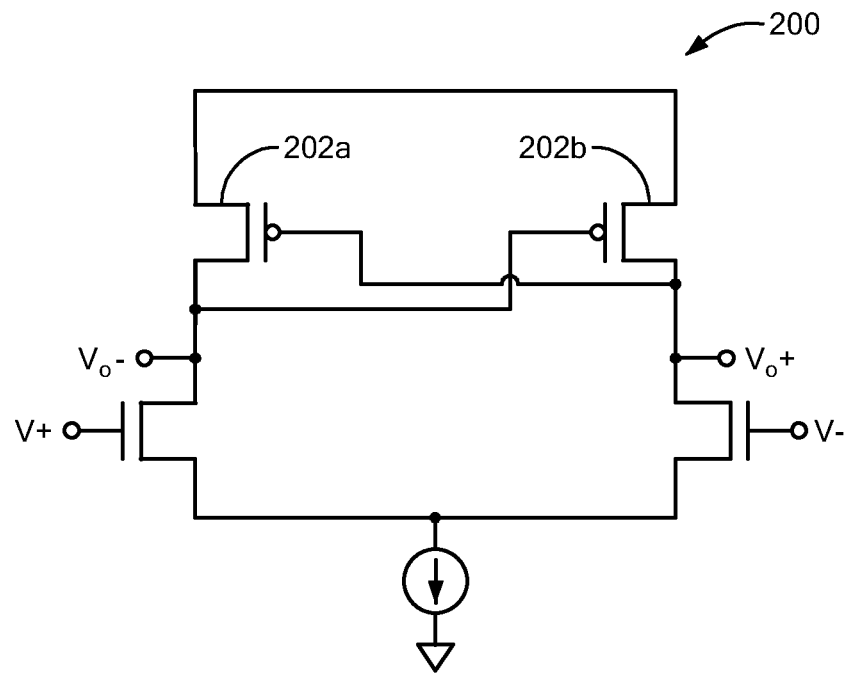
FIG. 2 shows a prior art latch having first and second switches connected in a cross coupled configuration that causes the switch to toggle between states.

FIG. 2 shows a prior art latch 200 having first and second switches 202a,b that are connected in a cross coupled configuration that causes the switch to toggle between states. As is known, in this latch 200, the threshold voltages move with the ratio of the transconductance gm of the p and n channel switches 202a,b. The lack of control for these parameters, and thus, the threshold, limits the use of this latch 200. That is, the thresholds are not stable.

Figure 3:
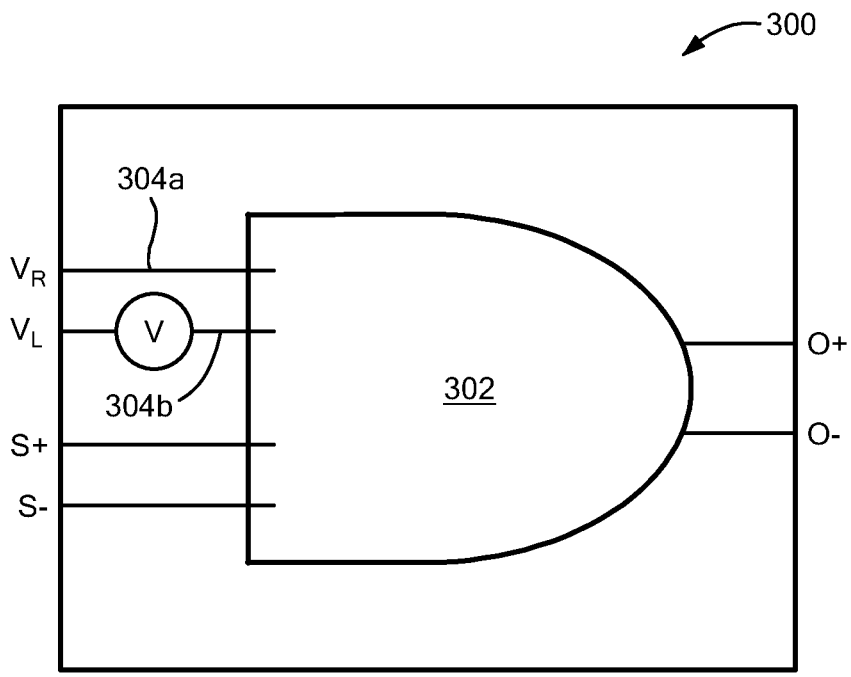
FIG. 3 shows an example latch having threshold voltages that are stable over process and temperature.

FIG. 3 shows an example latch 300 having threshold voltages that are stable over process and temperature and FIG. 3A shows an example circuit implementation. FIG. 3B shows a complete latch with dual circuit instantiations. In embodiments, the latch 300 responds in tens of picoseconds to small differential input signals. In the illustrated embodiment, the latch 300 has a differential current mode logic (CML) AND gate 302 with a controlled offset introduced between first and second voltage input terminals 304a,b configured to receive a differential input signal, such as $V_R$. $V_L$ of FIG. 1. In embodiments, the offset is controlled by making current sources 306, 308 with a bandgap voltage divided by the resistance of an offset resistor 310. Any suitable bandgap voltage circuit 314, such as that shown in FIG. 5, to provide a voltage bandgap reference voltage can be used. The currents provided by the current sources 306, 308 are inversely proportional to the resistance R of the offset resistor 310. By matching the material for the offset resistor 310 with the material used in the bandgap voltage divided by the resistance R of the offset resistor 310 a stable offset is achieved.

In embodiments, the offset is controlled to a millivolts level over process and temperature, which is desirable as signal pulses shrink over process corners. In embodiments, trimming is performed at the $V_R$. $V_L$ input terminals 304a,b, which can be achieved by tweaking the back bias voltages $V_A$. $V_B$ on the input devices. In embodiments, no such trimming is needed at the signal inputs 312a,b (S+ and S−) because these are stimulated by gained up signals.

It is understood that if the $V_L$ signal is applied to the node below resistor $R_{offset}$, then the voltage threshold $V_{thresh}$ is zero because setting $V_L$ and $V_R$ balances the currents requested by the lower MOSFETs M1, M2. Placing $V_L$ at the top of the resistor $R_{offset}$ changes the balance point (the voltage threshold) to the voltage drop across the resistor $R_{offset}$.

FIG. 3B shows an example latch implementation in which first and second AND gates 302a,b having offset stabilization are coupled together in a cross-coupled configuration. The first and second AND gates 302a,b receive input signals, such as voltages $V_R$. $V_L$ from a differential communication channel. The outputs O+, O− of the first AND gate 302a are coupled to inputs of the second AND gate 302b and the outputs O+, O− of the second AND gate are coupled to inputs of the first AND gate to form a full latch circuit. As used herein, this AND configuration is referred to as cross-coupled.

Figure 4:
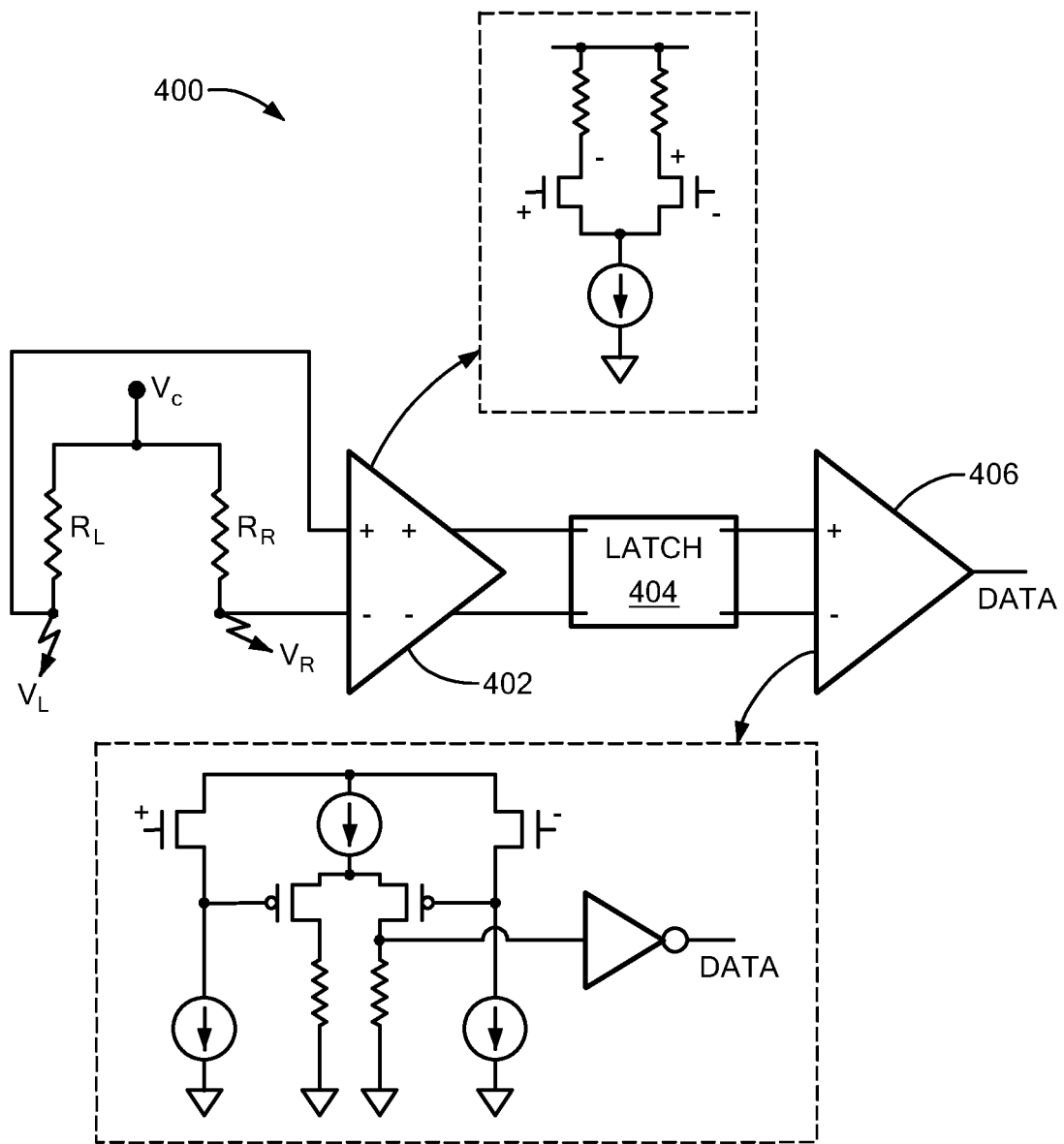
FIG. 4 shows an example circuit implementation of a receiver that includes a latch having offset stabilization.

FIG. 4 shows an example circuit implementation of a receiver 400 that includes a latch having offset stabilization. Differential voltage signals $V_R$, $V_L$ are coupled to a differential stage 402 which provides differential input signals to a latch 404 having offset stabilization. In the illustrated embodiment, a differential output of the latch is converted 406 to a single ended data signal. Differential pulses across the receiving resistors RL, RR are fed to the differential stage 402 to reduce the impact of any common mode voltage movement.

Example circuit implementations of the differential stage 402 and converter 406 are shown. It is understood that any suitable differential and converter circuits can be used to meet the needs of a particular application.

Figure 5:
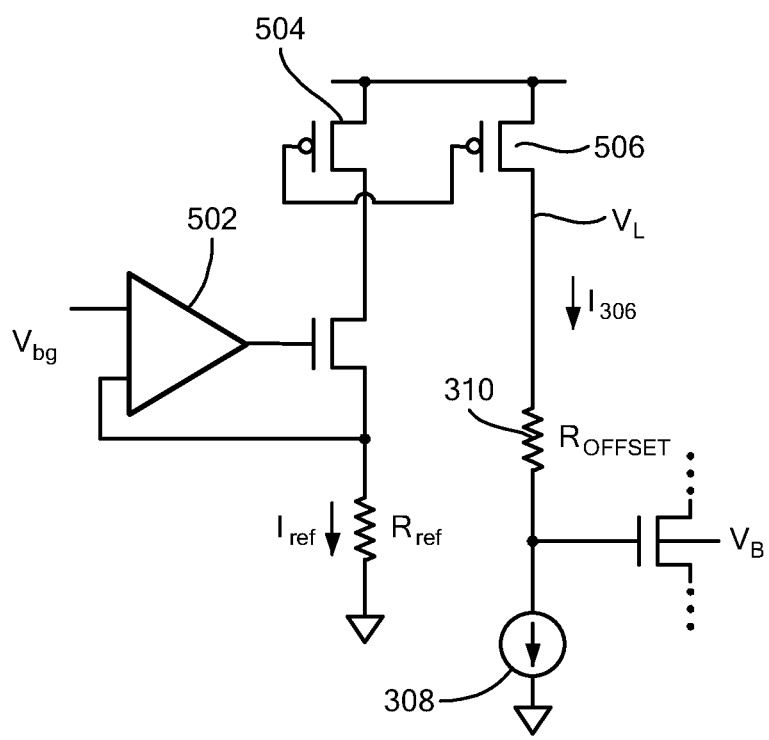
FIG. 5 shows an example circuit to provide a reset current for a stable latch threshold voltage.

FIG. 5 shows an example circuit configured so that the threshold latch thresholds remain constant over process and temperature. Current from the current source 306 in FIG. 3A is referred to as current $I_{306}$. Current $I_{306}$, which can be referred to as the offset current, and Roffset 310 from FIG. 3A are shown in the above circuit. An amplifier 502 is configured to maintain the top of the amplifier at the bandgap voltage Vbg. With this achieved, a current Iref through resistor Rref corresponds to Vbg/Rref. With the illustrated circuit connections, this current Iref then flows in a first device 504. A second device 506 mirrors the first device 504 current so that its supplies a scaled version (e.g., scale factor alpha (α)) of the first device 504 current to Roffset to create the voltage threshold in the latch, which is. $R_{offset} \times I_{306}$. The equation of the offset or threshold V thresh then is $$V_{thresh}=(R_{offset}*I_{306})=\text{Roffset}*\text{Alpha}*\text{Vbg}/\text{Rref}$$

This implies that $V_{thresh}=K*\text{Roffset}*\text{Rref}$ where K is a constant, because Vbg is constant over process and temperature and Alpha is the current mirror gain.

With process and temperature the resistance of the resistors change by a fraction, but because the resistors change by the same fraction, the ratio of resistances Roffset, Rref is unchanged. Thus, the voltage threshold $V_{thresh}$ of the latch does not change with process and temperature.

In example embodiments, current mode logic (CML) circuit configurations can be used. CML relies on current from a constant current generator directed to alternate paths depending upon whether the signal is a digital ONE or ZERO. The constant current generator may be connected to the two sources(S) of a pair of differential field effect transistors (FETs) with the respective drains (D) provide paths. In BJT implementations, the outputs are taken from the transistor collectors.

Example signal isolator configurations and applications are shown and described in U.S. Pat. Nos. 9,998,301, and 10,074,939 and 10,074,713 and 10,236,932 and 11,115,244 and 11,342,288, all of which are incorporated herein by reference.

Processing described above may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

What is claimed is:

1. A system having a receiver to receive data on a communication channel, comprising:
   a differential latch comprising:
   first and second circuits each having:
      first and second inputs to receive a differential input signal and first and second outputs to output a differential output signal, wherein the first and second circuits are cross-coupled, and wherein the first and second circuits are each configured to detect a pulse on the first and second differential input signals above a voltage threshold; and
      an offset structure to maintain the voltage threshold at a stable voltage level, comprising:
      a first current source and an offset resistor, wherein the first current source includes a bandgap circuit to flow an offset current through the offset resistor to maintain the voltage threshold at the stable voltage level.

2. The system according to claim 1, wherein the stable threshold comprises a positive differential swing Vdiff+ above 0.05V and a negative differential swing Vdiff− below −0.05V.

3. The system according to claim 1, wherein the latch comprises first and second AND gates cross-coupled to each other.

4. The system according to claim 3, wherein the first and second AND gates comprise differential current mode logic (CML) logic gates.

5. The system according to claim 1, wherein the bandgap circuit comprises a current mirror.

6. The system according to claim 5, wherein the bandgap circuit comprises a bandgap voltage as an input to an amplifier configured to output and maintain the bandgap voltage.

7. The system according to claim 6, further including a bandgap switch coupled to an output of the amplifier and a reference resistor coupled to the bandgap switch.

8. The system according to claim 7, wherein the reference resistor is coupled between the bandgap switch and ground.

9. The system according to claim 8, wherein the bandgap switch is coupled between the reference resistor and a current mirror, which is coupled to the offset resistor.

10. The system according to claim 9, wherein the voltage threshold is proportional to a scaling factor for the current mirror.

11. The system according to claim 10, wherein the voltage threshold $V_{thresh}$ is defined as the resistance $R_{offset}$ of the offset resistor times a current $I_{offset}$ through the offset resistor from the current mirror.

12. The system according to claim 10, wherein the voltage threshold $V_{thresh}$ is defined as the resistance $R_{offset}$ of the offset resistor times the resistance of the reference resistor $R_{ref}$ times a constant K such that $V_{thresh}=K*R_{offset}*R_{ref}$.

13. The system according to claim 12, wherein respective resistances of $R_{offset}$ and $R_{ref}$ change over temperature in the same way.

14. The system according to claim 12, wherein $R_{offset}$ and $R_{ref}$ comprise the same material.

15. The system according to claim 1, wherein the latch is capacitively isolated by respective capacitors from differential drivers for transmitting data to the latch.

16. The system according to claim 15, wherein the respective capacitors are less than 500 fF.

17. The system according to claim 15, wherein the latch and the drivers are on different dies, respectively.

18. The system according to claim 1, wherein the receiver forms part of a three-phase motor driver IC package.

19. A method, comprising:
receiving data on a communication channel by a receiver; and
latching the received data with differential latch, wherein the receiver comprises first and second circuits each having:
first and second inputs to receive a differential input signal and first and second outputs to output a differential output signal, wherein the first and second circuits are cross-coupled, and wherein the first and second circuits are each configured to detect a pulse on the first and second differential input signals above a voltage threshold; and
an offset structure to maintain the voltage threshold at a stable voltage level, comprising:
a first current source and an offset resistor, wherein the first current source includes a bandgap circuit to flow an offset current through the offset resistor to maintain the voltage threshold at a stable voltage level.

20. The method according to claim 19, wherein the stable threshold comprises a positive differential swing Vdiff+ above 0.25V and a negative differential swing Vdiff− below −0.25V.

21. The method according to claim 19, wherein the latch comprises first and second AND gates cross-coupled to each other.

22. The method according to claim 21, wherein the first and second AND gates comprise differential current mode logic (CML) logic gates.

23. The method according to claim 19, wherein the bandgap circuit comprises a current mirror.

24. The method according to claim 23, wherein the bandgap circuit comprises a bandgap voltage as an input to an amplifier configured to output and maintain the bandgap voltage.

25. The method according to claim 24, further including a bandgap switch coupled to an output of the amplifier and a reference resistor coupled to the bandgap switch.

26. The method according to claim 25, wherein the reference resistor is coupled between the bandgap switch and ground.

27. The method according to claim 26, wherein the bandgap switch is coupled between the reference resistor and a current mirror, which is coupled to the offset resistor.

28. The method according to claim 9, wherein the voltage threshold is proportional to a scaling factor for the current mirror.

29. The method according to claim 28, wherein the voltage threshold $V_{thresh}$ is defined as the resistance $R_{offset}$ of the offset resistor times a current $I_{offset}$ through the offset resistor from the current mirror.

30. The method according to claim 28, wherein the voltage threshold $V_{thresh}$ is defined as the resistance $R_{offset}$ of the offset resistor times the resistance of the reference resistor $R_{ref}$ times a constant K such that $V_{thresh}=K*R_{offset}*R_{ref}$.

31. The method according to claim 30, wherein respective resistances of $R_{offset}$ and $R_{ref}$ change over temperature in the same way.

32. The method according to claim 30, wherein $R_{offset}$ and $R_{ref}$ comprise the same material.

33. The method according to claim 19, wherein the latch is capacitively isolated by respective capacitors from differential drivers for transmitting data to the latch.

34. The method according to claim 33, wherein the respective capacitors are less than 500 fF.

35. The method according to claim 33, wherein the latch and the drivers are on different dies, respectively.

36. The method according to claim 19, wherein the receiver forms part of a three-phase motor driver IC package.

* * * * *

UNITED STATES PATENT AND TRADEMARK OFFICE
CERTIFICATE OF CORRECTION

PATENT NO. : 12,126,346 B1
APPLICATION NO. : 18/303740
DATED : October 22, 2024
INVENTOR(S) : John Horan et al.

It is certified that error appears in the above-identified patent and that said Letters Patent is hereby corrected as shown below:

In the Specification
Column 4, Line 57, delete "RL, RR" and replace with --$R_L$, $R_R$--.
Column 5, Line 1, delete "Roffset" and replace with --$R_{OFFSET}$--.
Column 5, Line 4, delete "Vbg." and replace with --$V_{bg}$.--.
Column 5, Line 4, delete "Iref" and replace with --$I_{ref}$--.
Column 5, Line 5, delete "Rref corresponds to Vbg/Rref." and replace with --$R_{ref}$ corresponds to $V_{bg}/R_{ref}$.--.
Column 5, Line 6, delete "Iref" and replace with --$I_{ref}$--.
Column 5, Line 10, delete "Roffset" and replace with --$R_{OFFSET}$--.
Column 5, Line 11, delete "V thresh" and replace with --$V_{thresh}$--.
Column 5, Line 14, delete "=Roffset*Alpha*Vbg/Rref" and replace with --=$R_{offset}$*Alpha*$V_{bg}/R_{ref}$--.
Column 5, Line 15, delete "*Roffset*Rref" and replace with --*$R_{offset}$*$R_{ref}$--.
Column 5, Line 16, delete "Vbg" and replace with --$V_{bg}$--.
Column 5, Line 20, delete "Roffset, Rref" and replace with --$R_{offset}$, $R_{ref}$--.

In the Claims
Column 7, Line 29, delete "with differential" and replace with --with a differential--.

Signed and Sealed this
Thirteenth Day of May, 2025

Coke Morgan Stewart
*Acting Director of the United States Patent and Trademark Office*